United States Patent
Enokizono et al.

(10) Patent No.: US 10,192,669 B2
(45) Date of Patent: Jan. 29, 2019

(54) VECTOR MAGNETIC CHARACTERISTIC CONTROLLED MATERIAL AND IRON CORE

(71) Applicants: TOSHIBA INDUSTRIAL PRODUCTS & SYSTEMS CORPORATION, Kawasaki-shi, Kanagawa (JP); NATIONAL UNIVERSITY CORPORATION OITA UNIVERSITY, Oita-shi, Oita (JP)

(72) Inventors: Masato Enokizono, Oita (JP); Hiromu Shiota, Mie (JP); Eiji Shimomura, Mie (JP); Tsuyoshi Masuda, Mie (JP)

(73) Assignees: TOSHIBA INDUSTRIAL PRODUCTS & SYSTEMS CORPORATION, Kawasaki-Shi (JP); NATIONAL UNIVERSITY CORPORATION OITA UNIVERSITY, Oita-Shi, Oita (JP)

( * ) Notice: Subject to any disclaimer, the term of this patent is extended or adjusted under 35 U.S.C. 154(b) by 165 days.

(21) Appl. No.: 15/100,095

(22) PCT Filed: Nov. 21, 2014

(86) PCT No.: PCT/JP2014/080920
§ 371 (c)(1),
(2) Date: May 27, 2016

(87) PCT Pub. No.: WO2015/080051
PCT Pub. Date: Jun. 4, 2015

(65) Prior Publication Data
US 2017/0278617 A1    Sep. 28, 2017

(30) Foreign Application Priority Data
Nov. 29, 2013    (JP) .................................. 2013-247727

(51) Int. Cl.
H01F 1/16      (2006.01)
H01F 27/245    (2006.01)
(Continued)

(52) U.S. Cl.
CPC ....... *H01F 27/245* (2013.01); *G01R 33/0064* (2013.01); *G01R 33/123* (2013.01);
(Continued)

(58) Field of Classification Search
None
See application file for complete search history.

(56) References Cited

U.S. PATENT DOCUMENTS 4,363,677 A * 12/1982 Ichiyama ................. C21D 1/09
                                                148/111
4,545,828 A * 10/1985 Schoen ............... H01F 1/14775
                                                148/111
(Continued)

FOREIGN PATENT DOCUMENTS

JP    S54-84229    7/1979
JP    S56-60005    5/1981
(Continued)

OTHER PUBLICATIONS

Abstract of JP 06-251966 A (Year: 1994).*
(Continued)

*Primary Examiner* — Kevin M Bernatz
(74) *Attorney, Agent, or Firm* — DLA Piper LLP US

(57) ABSTRACT

A vector-magnetic-property-controlling material according to the present embodiment is subjected to a scratching process in two directions that intersect on the surface of a steel material. An iron core according to the present embodiment is configured from an oriented magnetic steel material which has been subjected to a scratching process in two directions that intersect on the surface thereof.

8 Claims, 17 Drawing Sheets

(51) Int. Cl.
*H01F 30/12* (2006.01)
*G01R 33/00* (2006.01)
*H02K 1/02* (2006.01)
*G01R 33/12* (2006.01)
*H01F 3/00* (2006.01)

(52) U.S. Cl.
CPC .............. *H01F 1/16* (2013.01); *H01F 30/12* (2013.01); *H02K 1/02* (2013.01); *H01F 3/00* (2013.01)

(56) References Cited

U.S. PATENT DOCUMENTS 5,089,062 A * 2/1992 Pavlik ................. C21D 8/1294
 148/110
8,734,658 B2 * 5/2014 Iwata ...................... C21D 8/12
 148/306

FOREIGN PATENT DOCUMENTS

| JP | S56-105424 | 8/1981 |
| JP | S57-2252 | 1/1982 |
| JP | S58-26405 | 2/1983 |
| JP | S60-192310 | 9/1985 |
| JP | 06251966 A * | 9/1994 |
| JP | 2004-103965 | 4/2004 |
| JP | 2008-60353 | 3/2008 |
| WO | WO 2010-147009 | 12/2010 |

OTHER PUBLICATIONS

Japanese Office Action (with English Translation) issued in JP 2013-247727 dated Jun. 20, 2017.
International Search Report (with English Translation) issued in International Application No. PCT/JP2014/080920 dated Mar. 3, 2015.
Written Opinion (with English Translation) issued in International Application No. PCT/JP2014/080920 dated Mar. 3, 2015.
International Preliminary Report on Patentability issued in International Application No. PCT/JP2014/080920 dated May 31, 2016.
English Language Abstract of JP S56-105424 dated Aug. 21, 1981.
English Language Abstract and English Language Translation of JP 2004-103965 dated Apr. 2, 2004.
English Language Abstract of WO 2010-147009 dated Dec. 23, 2010.
English Language Abstract of JP S60-192310 dated Sep. 30, 1985.
English Language Abstract and English Language Translation of JP S56-060005 dated May 23, 1981.
English Language Abstract of JP S54-084229 dated Jul. 5, 1979.
English Language Abstract and English Language Translation of JP 2008-060353 dated Mar. 13, 2008.

* cited by examiner

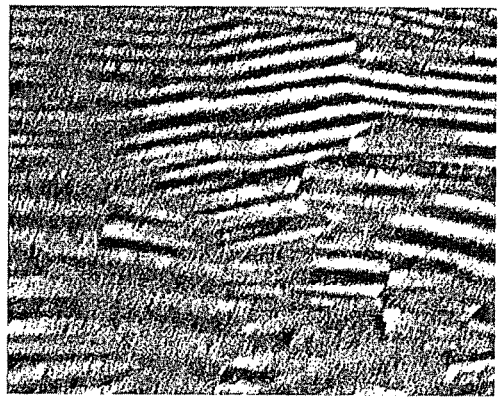 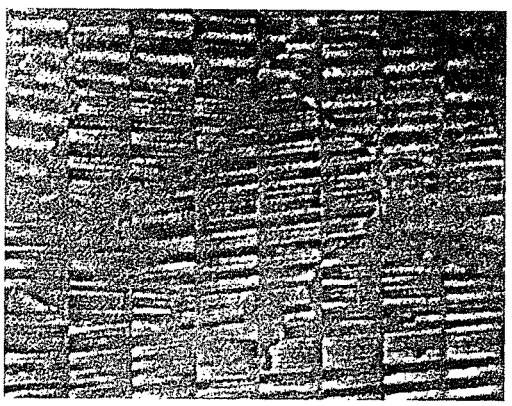
FIG.4A   FIG.4B
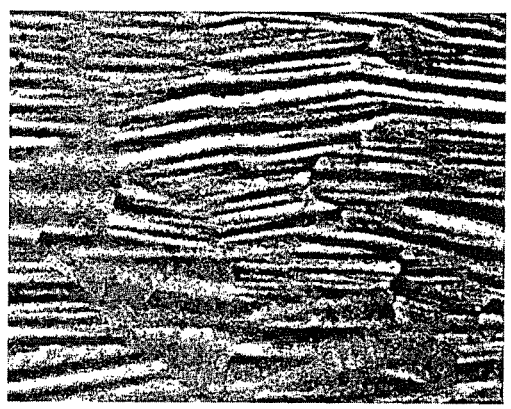 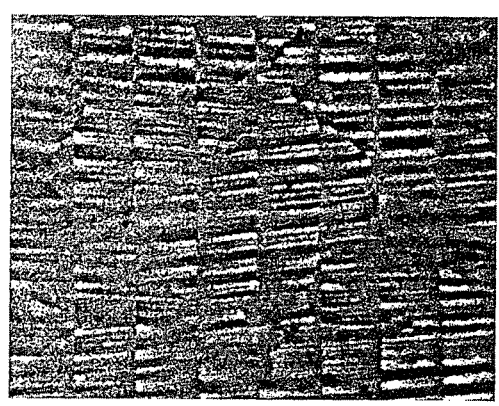
FIG.4C   FIG.4D

| PL[mm] | 2.00 | 1.00 | 0.50 | 0.25 |
|---|---|---|---|---|
| Iron loss reduction rate [%] | 12.9 | 19.0 | 30.5 | 28.6 |

FIG.6

Specifications of the laser irradiation

| Laser power | 20 W |
|---|---|
| Laser speed | 8000 mm/s |
| Laser mode | Continuous wave mode |
| Scratch direction | TD, RD |

FIG.8

Magnetic domain structures

Rolling direction (RD)

VECTOR MAGNETIC CHARACTERISTIC CONTROLLED MATERIAL AND IRON CORE

TECHNICAL FIELD

The present invention relates to vector magnetic characteristic controlled material obtained by performing a magnetic domain ultra-refinement process on grain-oriented electrical steel itself as well as to an iron core made of the vector magnetic characteristic controlled material.

BACKGROUND ART

In recent years, as a major technology trend in transformers and rotating machines, energy saving and efficiency enhancement have been underway including, for example, establishment of standards prescribing efficiency improvements. In particular, to reduce no-load loss, which is power loss caused in the iron core, i.e., so-called "iron loss," each maker is committed to improvements of iron core materials and improvements of iron core structures.

Under these circumstances, for example, so-called grain-oriented electrical steel, which is intended to reduce loss, is adopted for the iron cores of transformers. As measures to make such improvements, measures such as high orientation impartment, magnetic domain refinement control, and reduction of plate thickness have been taken.

Among others, the magnetic domain refinement control is the latest iron loss reduction technology developed in Japan. That is, so-called grain-oriented electrical steel has a crystal structure, for example, as shown in FIG. 16, and each crystal is structured to have fine magnetic domains as shown, for example, in FIG. 17. Here, under a condition in which no magnetic field is applied externally to the grain-oriented electrical steel, magnetic domains parallel to each other have magnetic fields oriented in directions different from each other. Consequently, the magnetic fields cancel each other in the grain-oriented electrical steel as a whole, curbing iron loss.

However, when a magnetic field is applied externally to the grain-oriented electrical steel, magnetic domain walls which are boundaries of magnetic domains move, and a region magnetized in the same direction as the external magnetic field spreads. This makes it impossible to cancel out the magnetic fields in the grain-oriented electrical steel as a whole and consequently, iron loss cannot be curbed. In particular, when grain-oriented electrical steel is magnetized by an alternating current, a moving direction of a magnetic domain wall alternates, and thus energy involved in the movement of the magnetic domain wall tends to result in iron loss.

Here, a definite correlation has been recognized between iron loss and moving velocity of the magnetic domain wall, and higher the moving velocity of the magnetic domain wall, the larger the iron loss. Thus, paying attention to this point, magnetic domain refinement control finely divides a magnetic domain in a width direction, which is a direction at right angles to a rolling direction to reduce a distance traveled by the magnetic domain wall in 1 cycle of alternating current. This makes it possible to reduce the moving velocity of the magnetic domain wall and curb iron loss. Note that regarding techniques for finely dividing a magnetic domain, methods put to practical use include a method which applies local thermal stress by irradiating a surface of grain-oriented electrical steel with laser or plasma and a method which applies mechanical stress to a surface of grain-oriented electrical steel using gears. Generally, such a technique is called a scratching process.

The conventional scratching process, which is intended to finely divide each magnetic domain in one direction along the width direction of the magnetic domain, involves forming linear laser marks in one direction as disclosed, for example, in Patent Literatures 1 to 6. Consequently, since the magnetic domains can be finely divided only in the width direction, the process is effective in reducing iron loss during magnetization of the grain-oriented electrical steel in the rolling direction, but is not effective in reducing iron loss during magnetization in a direction at angles to the rolling direction. Therefore, if an iron core which has a part also magnetized in a direction other than a direction parallel to the rolling direction RD, e.g., in a direction TD, such as the width direction, perpendicular to the rolling direction RD, is made of grain-oriented electrical steel, an iron loss reduction effect is limited, where such iron cores include an iron core of a three phase transformer, an iron core with gaps, and an iron core of a rotating machine.

CITATION LIST

Patent Literature

Patent Literature 1: Japanese Patent Publication No. 57-2252
Patent Literature 2: Japanese Patent Publication No. 58-26405
Patent Literature 3: Japanese Patent Laid-Open No. 60-192310
Patent Literature 4: Japanese Patent Laid-Open No. 56-60005
Patent Literature 5: Japanese Patent Laid-Open No. 54-84229
Patent Literature 6: Japanese Patent Laid-Open No. 2008-60353

SUMMARY OF INVENTION

Technical Problem

Improvements in techniques for the scratching process described above are made mainly by manufacturers of grain-oriented electrical steel rather than users who produce iron cores and the like using the grain-oriented electrical steel. However, on the part of the manufacturers, there are circumstances in which it is not possible to sufficiently understand or predict that the produced grain-oriented electrical steel is used on the part of the users for what part of what iron core in which direction. Therefore, the manufacturers are committed to improvements of the current "unidirectional" scratching process, and it is left up to the users to decide how to use the grain-oriented electrical steel subjected to the unidirectional scratching process.

Thus, there has been no opportunity for the manufacturers to have incentives for, or get an idea of, improving techniques which assume magnetization in a direction at angles to the rolling direction RD.

Thus, the inventor provides an invention from a point of view based on a vector magnetic characteristic theory totally different from conventional ones. That is, whereas conventional ideas are limited to cases in which a magnetic field H is small, based on a point of view that even if the magnetic field H increases, loss can be reduced greatly by decreasing a phase-angle difference between vectors of the magnetic flux density B and magnetic field H, the inventor has greatly improved material by applying vector magnetic characteristic control process, i.e., magnetic domain ultra-refinement process, to grain-oriented electrical steel itself.

Solution to Problem

A vector magnetic characteristic controlled material according to the present invention is obtained through magnetic domain ultra-refinement by applying a linear scratching process to a surface of grain-oriented electrical steel itself in two directions intersecting each other.

That is, the vector magnetic characteristic controlled material according to the present invention is an invention made based on an idea which a manufacturer of the grain-oriented electrical steel, i.e., a main developer of the grain-oriented electrical steel, has never conceived of, and is a vector magnetic characteristic controlled material resulting from controlling so-called vector magnetic characteristics of the grain-oriented electrical steel.

Advantageous Effects of Invention

The vector magnetic characteristic controlled material according to the present invention greatly reduces iron loss including hysteresis loss and eddy current loss. The eddy current loss can be reduced by 12.9 to 30.5% as presented in embodiments described later. In view of the fact that an iron loss reduction rate of the grain-oriented electrical steel subjected to the conventional unidirectional scratching process is around 6.7 to 7.5%, this is a very remarkable reduction rate far beyond expectations.

The vector magnetic characteristic controlled material according to the present invention has an extremely wide range of uses, and is applicable to, but not limited to, for example, a T-joint, a part having gaps, a yoke portion, a leg portion, and the like in the iron core of a three phase transformer. Also, being applied to electromagnetic stators and electromagnetic rotators of dynamo-electric machines and the like, the vector magnetic characteristic controlled material greatly reduces iron loss and achieves high functional stability, great power savings, and extended life of transformers, the dynamo-electric machines, and the like.

BRIEF DESCRIPTION OF DRAWINGS

FIGS. 4(a) to 4(d) are macrophotographs of surfaces of grain-oriented electrical steel.

FIG. 6 is a diagram showing an example of changes in an iron loss reduction rate with the parallel spacing of the scratching process.

FIG. 8 is a diagram showing an example of operating conditions of a laser irradiation apparatus.

DESCRIPTION OF EMBODIMENTS

Figure 1:
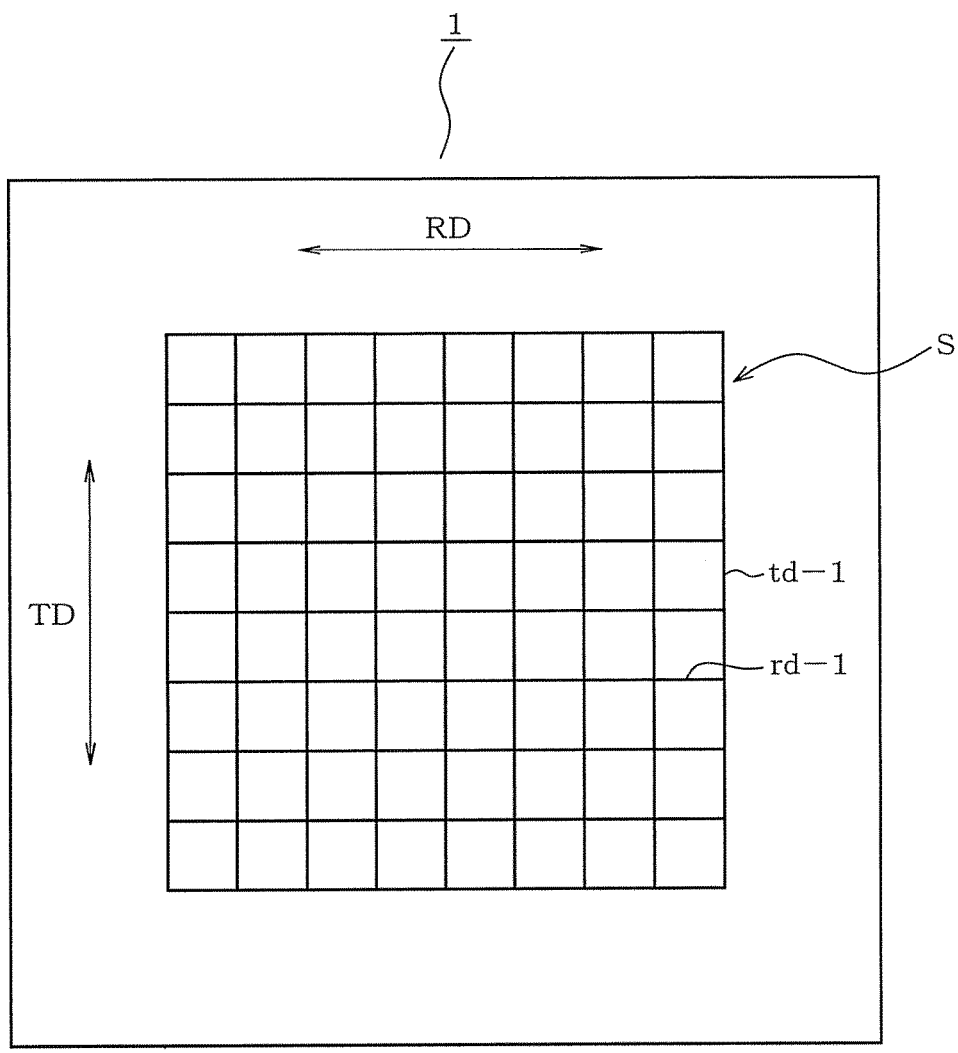
FIG. 1 is a plan view of grain-oriented electrical steel according to a first embodiment.

Embodiments of a magnetic domain ultra-refinement process of vector magnetic characteristic controlled material according to the present invention and embodiments of application thereof will be described below with reference to the accompanying drawings, where the vector magnetic characteristic controlled material is obtained through magnetic domain ultra-refinement by applying a linear scratching process on a surface of grain-oriented electrical steel itself in two directions intersecting each other. Note that substantially the same elements in different embodiments are denoted by the same reference numerals, and description thereof will be omitted.

First Embodiment

For example, as shown in FIG. 1, unlike the conventional unidirectional linear scratching process, a magnetic domain ultra-refinement process of grain-oriented electrical steel 1 according to this first embodiment involves carrying out a scratching process S of first direction lines rd-1 and second direction lines td-1 intersecting each other by running on a surface of the steel along a rolling direction RD and a direction TD perpendicular to the rolling direction RD. In this case, the first direction lines rd-1 are set to exactly or almost coincide with the rolling direction RD of the grain-oriented electrical steel 1. Also, the second direction lines td-1 are set to the direction TD exactly perpendicular or to the direction almost at right angles to the rolling direction RD of the grain-oriented electrical steel 1. Besides, the first direction lines rd-1 and second direction lines td-1 are so related as to be exactly or almost at right angles to each other. Note that the first direction lines rd-1 may be set to a direction which has a predetermined displacement angle with respect to the rolling direction RD. Also, the second direction lines td-1 may be set to a direction which has a predetermined displacement angle with respect to the direction TD perpendicular to the rolling direction RD of the grain-oriented electrical steel 1. Also, the first direction lines rd-1 and second direction lines td-1 do not need to be so related as to be at right angles to each other, and may be set to have a relationship in which one is inclined at a predetermined displacement angle with respect to the other.

Figure 2:
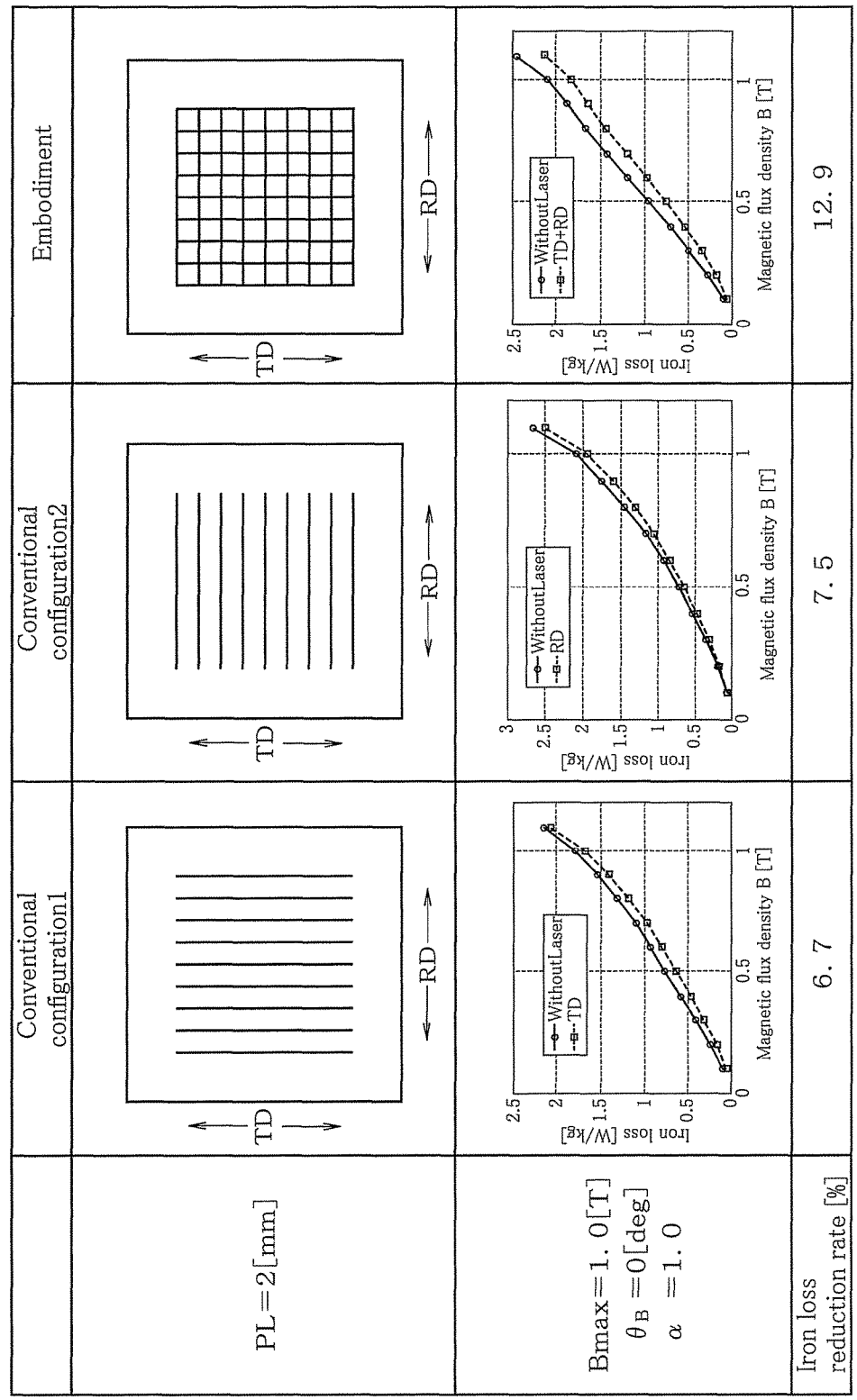
FIG. 2 is a diagram showing an example of actual measurement results on reduction rates of iron loss, i.e., an eddy current loss.
Figure 3A:
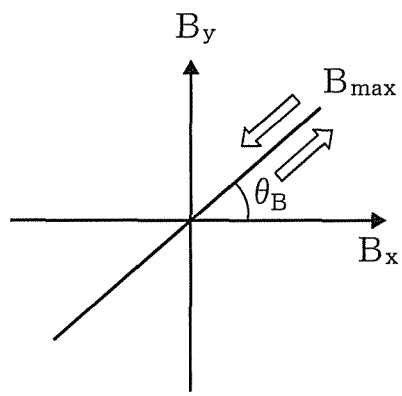
FIGS. 3(a) and 3(b) are diagrams showing an example of a state of a magnetic flux generated when grain-oriented electrical steel is excited by a revolving magnetic field.
Figure 3B:
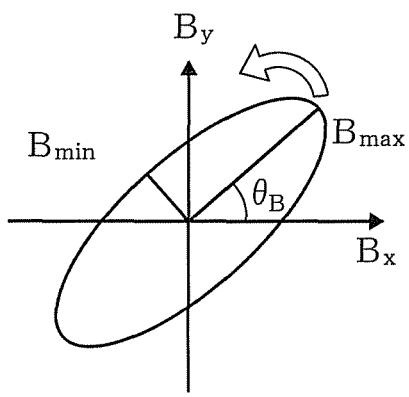

For example, actual measurement results shown in FIG. 2 were obtained by actually creating the grain-oriented electrical steel 1 according to this first embodiment through the scratching process S of the first direction lines rd-1 and second direction lines td-1 and comparing iron loss caused when the grain-oriented electrical steel 1 was excited by an effective revolving magnetic field and iron loss caused when conventional grain-oriented electrical steel was excited by an effective revolving magnetic field, in order to compare iron losses in all magnetization directions. Note that as the conventional grain-oriented electrical steel, conventional configuration 1 and conventional configuration 2 were used, where conventional configuration 1 was obtained by applying the scratching process of the second direction lines td-1 only in the direction TD perpendicular to the rolling direction RD and conventional configuration 2 was obtained by applying the scratching process of the first direction lines rd-1 only in the rolling direction RD. Also, for example, FIG. 3 shows a state of a magnetic flux generated when grain-oriented electrical steel is excited by a revolving magnetic field. That is, excitation by a revolving magnetic field results in generation of, for example, an alternating magnetic flux such as shown in FIG. 3(a) and a rotating magnetic flux such as shown in FIG. 3(b).

Note that in the present actual measurements, a maximum magnetic flux density (Bmax) was 1.0 [T]. However, the maximum magnetic flux density can fluctuate, for example, in a range of 0.1 to 1.1 [T]. Also, a tilt angle ($\theta_B$) was 0 [deg]. Also, an axis ratio ($\alpha$) was 1.0. The axis ratio ($\alpha$) is a value ($\alpha$=Bmin/Bmax) obtained by dividing a minimum magnetic flux density (Bmin) by the maximum magnetic flux density (Bmax).

Actual measurements were taken under the above conditions and results thereof are shown in FIG. 2 by example. According to the results, in the case of the grain-oriented electrical steel of conventional configuration 1 obtained by applying the scratching process of the second direction lines td-1 only in the direction TD perpendicular to the rolling direction RD, the iron loss reduction rate remained to be only 6.7 [%]. Also, in the case of the grain-oriented electrical steel of conventional configuration 2 obtained by applying the scratching process of the first direction lines rd-1 only in the rolling direction RD, the iron loss reduction rate remained to be only 7.5 [%]. In contrast, in the case of the grain-oriented electrical steel 1 according to this first embodiment subjected to the scratching process S of the first direction lines rd-1 and second direction lines td-1, the iron loss reduction rate was 12.9 [%]. That is, it was confirmed that the grain-oriented electrical steel 1 according to the present embodiment achieved a remarkably higher iron loss reduction rate than the grain-oriented electrical steel subjected to the conventional unidirectional linear scratching process.

For example, FIG. 4 shows macrophotographs of surfaces of grain-oriented electrical steel. FIG. 4(a) magnifies and shows a surface of grain-oriented electrical steel subjected to a scratching process of neither first direction lines rd-1 nor second direction lines td-1 (Without laser), FIG. 4(b) magnifies and shows a surface of grain-oriented electrical steel subjected to a scratching process of second direction lines td-1 only along the direction TD perpendicular to the rolling direction RD (Laser scratches in the TD), FIG. 4(c) magnifies and shows a surface of grain-oriented electrical steel subjected to a scratching process of only first direction lines rd-1 parallel to the rolling direction RD (Laser scratches in the RD), and FIG. 4(d) magnifies and shows a surface of grain-oriented electrical steel subjected to a scratching process of direction lines rd-1 parallel to the rolling direction RD and direction lines td-1 parallel to the direction TD perpendicular to the rolling direction RD with the direction lines rd-1 and direction lines td-1 intersecting each other (Laser scratches in the TD+RD). In other words, it can be seen that on the grain-oriented electrical steel shown in FIG. 4(d), i.e., the grain-oriented electrical steel according to the present embodiment, magnetic domains are divided more finely than on the conventional grain-oriented electrical steel shown in FIGS. 4(a) to 4(c).

Figure 5:
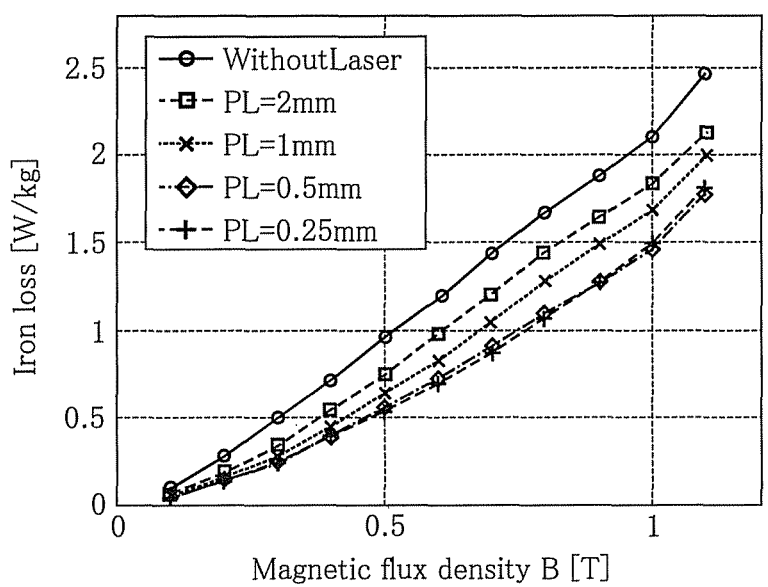
FIG. 5 is a diagram showing an example of actual measurement results on iron loss reduction rates obtained by varying parallel spacing among lines produced by a scratching process.

Also, the scratching process of the first direction lines rd-1 and second direction lines td-1 according to this first embodiment is performed with predetermined parallel spacing with respect to any of the direction lines. In this case, preferably the predetermined parallel spacing is set to a value equal to or smaller than 2 [mm] excluding 0 [mm]. For example, actual measurement results shown in FIG. 5 show changes in iron loss occurring during excitation by a revolving magnetic field when the predetermined parallel spacing among the direction lines rd-1 as well as among the direction lines td-1 in the scratching process are varied in a range of 2 [mm] to 0.25 [mm]. FIG. 6 is a diagram showing an example of changes in an iron loss reduction rate with the spacing of the scratching process. That is, when the parallel spacing PL (Laser scratches Pitch) among the direction lines rd-1 as well as among the direction lines td-1 for the scratching process was set to 2.00 [mm], the iron loss reduction rate was 12.9 [%]. Also, when the parallel spacing PL among the direction lines rd-1 as well as among the direction lines td-1 for the scratching process was set to 1.00 [mm], the iron loss reduction rate was 19.0 [%]. Also, when the parallel spacing PL among the direction lines rd-1 as well as among the direction lines td-1 for the scratching process was set to 0.50 [mm], the iron loss reduction rate was 30.5 [%]. Also, when the parallel spacing PL among the direction lines rd-1 as well as among the direction lines td-1 for the scratching process was set to 0.25 [mm], the iron loss reduction rate was 28.6 [%]. Thus, based on the present actual measurement results, it was confirmed that the iron loss reduction rate was the highest when the parallel spacing PL among the direction lines rd-1 as well as among the direction lines td-1 for the scratching process was set to 0.50 [mm]. Also, it was confirmed that the iron loss reduction rate tended to be high when the parallel spacing PL among the direction lines rd-1 as well as among the direction lines td-1 for the scratching process was narrow.

As a result of the present actual measurements, it was confirmed that significant iron loss reductions were available when the parallel spacing PL among the direction lines rd-1 as well as among the direction lines td-1 for the scratching process was 2.00 [mm] to 0.25 [mm]. Note that in the present actual measurements, the parallel spacing of the direction lines rd-1 and direction lines td-1 for the scratching process along the direction RD was set equal to the parallel spacing of the direction lines rd-1 and direction lines td-1 for the scratching process along the direction TD. However, the parallel spacing of the direction lines rd-1 and direction lines td-1 for the scratching process along the direction RD may be set different from the parallel spacing of the direction lines rd-1 and direction lines td-1 for the scratching process along the direction TD. Also, the parallel spacing of the direction lines rd-1 and direction lines td-1 for the scratching process in at least only one of the directions TD and RD may be set to a value equal to or smaller than 2 [mm] excluding 0 [mm], and more preferably to a value in a range of 2.00 [mm] to 0.25 [mm].

Figure 7:
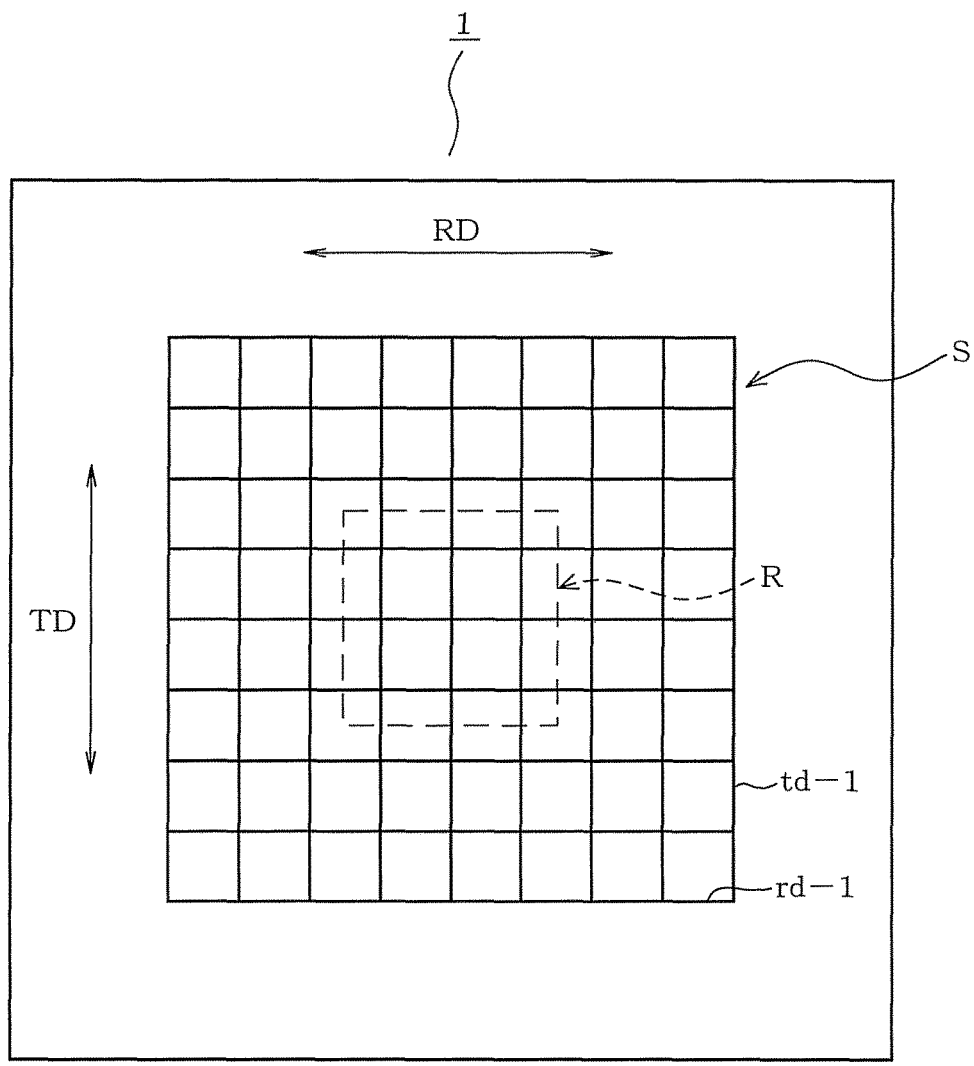
FIG. 7 is a plan view of grain-oriented electrical steel, showing an example of a measurement area for iron loss reduction rates.

Note that in this first embodiment, for example, as shown in FIG. 7, reduction of iron loss occurring, for example, in an 80 [mm] by 80 [mm] measurement area R set up almost in a central portion of the grain-oriented electrical steel 1 was measured. Also, in the present embodiment the scratching process was performed on the grain-oriented electrical steel 1 using a non-illustrated well-known laser irradiation apparatus made up, for example, of a galvano scanner. In this case, for example, as shown in FIG. 8, laser power was set to 20 [W], laser speed was set to 8000 [mm/s], laser mode was set to continuous wave mode in which a waveform was continuous, and a laser scanning direction (Scratch direction) was set to two directions: the direction TD and direction RD.

On the grain-oriented electrical steel 1 according to this first embodiment, since the scratching process of the first direction lines rd-1 and second direction lines td-1 intersecting each other is applied to the surface of the steel, magnetic domains are finely divided not only in the width direction, which is the direction TD perpendicular to the rolling direction RD of the steel, but also in a length direction, which is a direction along the rolling direction RD of the steel, implementing an extremely fine magnetic domain structure. This results in a magnetic domain structure in which each magnetic domain is divided into plural nearly granular magnetic domains. Consequently, even if a magnetic field is tilted to the direction in which magnetic domains are lined up, the magnetic domain wall moves according to the tilt of the magnetic field in each of the magnetic domains lined up in the length direction. This allows the magnetic domain walls to move smoothly, making it possible to reduce iron loss even when the steel is magnetized in a direction at predetermined angles to the rolling direction RD of the steel.

Second Embodiment

Figure 9:
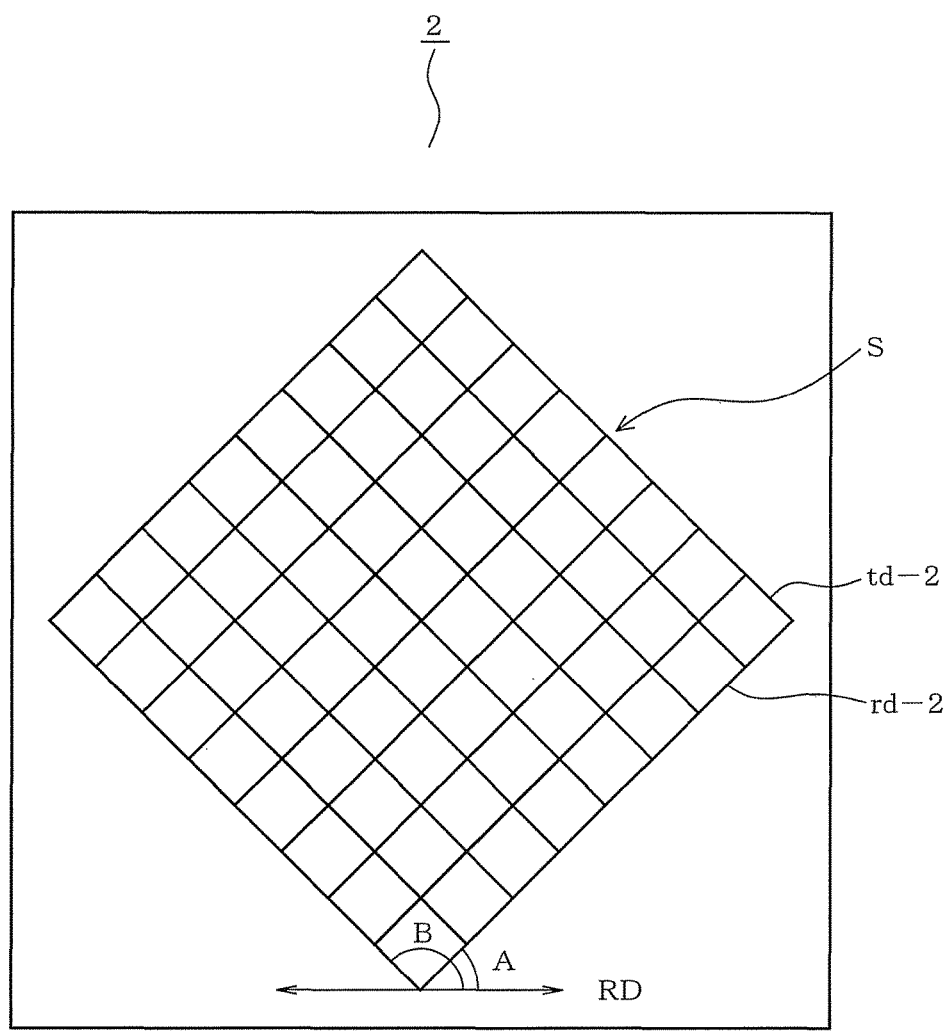
FIG. 9 is a plan view of grain-oriented electrical steel according to a second embodiment.

Unlike before, the magnetic domain ultra-refinement process of the grain-oriented electrical steel 2 shown, for example, in FIG. 9 uses a linear scratching process S along both first and second direction lines rd-2 and td-2 intersecting each other. In this case, the first direction lines rd-2 are set to a direction tilted at a predetermined angle A to the rolling direction RD of the grain-oriented electrical steel 1. In this case, the predetermined angle A is set to 45 [°]. Also, the second direction lines td-2 are set to a direction tilted at a predetermined angle B to the rolling direction RD of the grain-oriented electrical steel 1. In this case, the predetermined angle B is set to 135 [°]. The first direction lines rd-2 and second direction lines td-2 intersect each other in such a relationship as to be exactly or almost at right angles to each other. Note that the predetermined angle A of the first direction lines rd-2 can be provided by being changed as appropriate. Also, the predetermined angle B of the second direction lines td-2 can be provided by being changed as appropriate. Also, the first direction lines rd-2 and second direction lines td-2 do not need to intersect each other in such a relationship as to be at right angles to each other and may be set to have a relationship in which one is inclined with respect to the other. Also, the parallel spacing of the scratching process of the first direction lines rd-2 and second direction lines td-2 can be provided by being changed as appropriate.

Figure 10A:
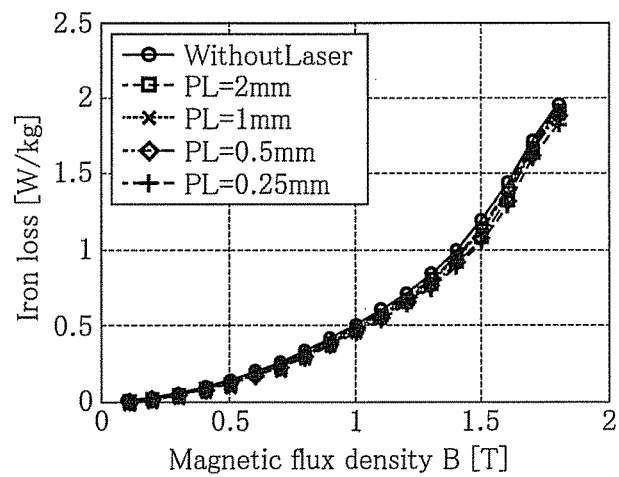
FIGS. 10(a) and 10(b) are diagrams showing an example of results of comparison between iron loss reduction rates of the grain-oriented electrical steel according to the first embodiment and iron loss reduction rates of grain-oriented electrical steel according to the second embodiment (Part 1).
Figure 10B:
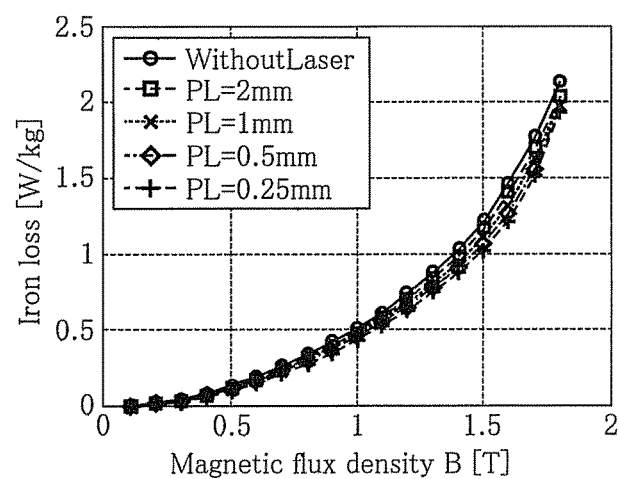

For example, FIG. 10 compares and shows the iron loss reduction rate (a) of the grain-oriented electrical steel 1 according to the first embodiment and iron loss reduction rate (b) of the grain-oriented electrical steel 2 according to the second embodiment. That is, it was confirmed that the grain-oriented electrical steel 2 achieved an iron loss reduction rate approximately equal to that of the grain-oriented electrical steel 1. Note that, in the comparison test, the maximum magnetic flux density (Bmax) of the revolving magnetic field was 0.1 to 1.8 [T], the tilt angle ($\theta_B$) was 0 [deg], and the axis ratio ($\alpha$) was 0.

Figure 11A:
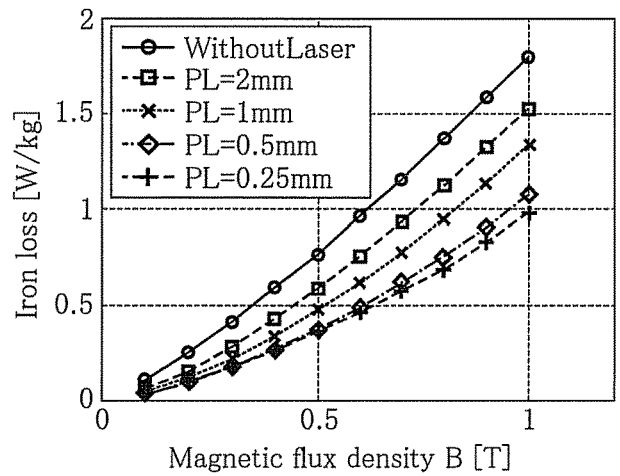
FIGS. 11(a) and 11(b) are diagrams showing an example of results of comparison between iron loss reduction rates of the grain-oriented electrical steel according to the first embodiment and iron loss reduction rates of the grain-oriented electrical steel according to the second embodiment (Part 2).
Figure 11B:
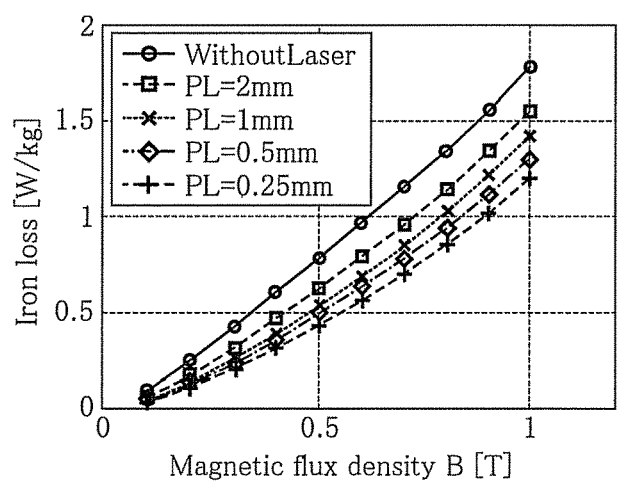

Also, for example, FIG. 11 compares and shows the iron loss reduction rate (a) of the grain-oriented electrical steel 1 according to the first embodiment and iron loss reduction rate (b) of the grain-oriented electrical steel 2 according to the second embodiment. That is, it was confirmed that the grain-oriented electrical steel 2 achieved an iron loss reduction rate approximately equal to that of the grain-oriented electrical steel 1. Note that, in the comparison test, the maximum magnetic flux density (Bmax) of the revolving magnetic field was 0.1 to 1.0 [T], the tilt angle ($\theta_B$) was 90 [deg], and the axis ratio ($\alpha$) was 0.

Figure 12A:
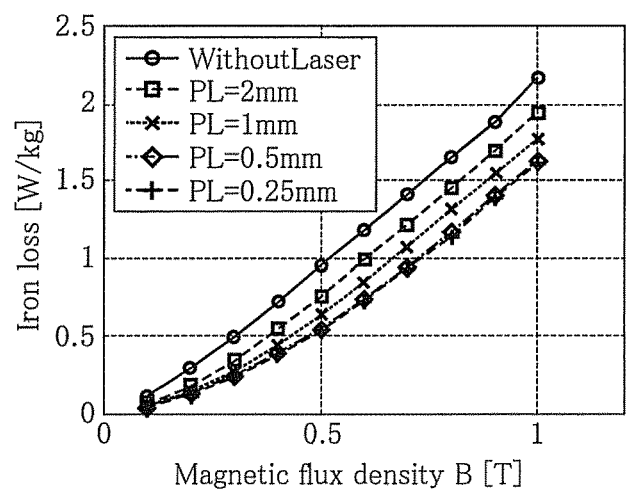
FIGS. 12(a) and 12(b) are diagrams showing an example of results of comparison between iron loss reduction rates of the grain-oriented electrical steel according to the first embodiment and iron loss reduction rates of the grain-oriented electrical steel according to the second embodiment (Part 3).
Figure 12B:
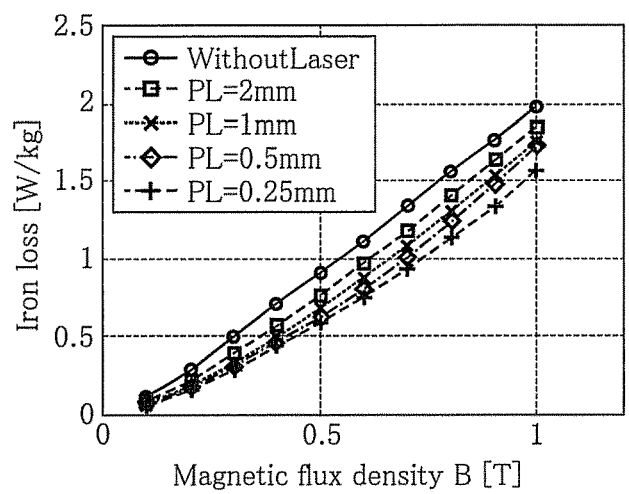

Also, for example, FIG. 12 compares and shows the iron loss reduction rate (a) of the grain-oriented electrical steel 1 according to the first embodiment and iron loss reduction rate (b) of the grain-oriented electrical steel 2 according to the second embodiment. That is, it was confirmed that the grain-oriented electrical steel 2 achieved an iron loss reduction rate approximately equal to that of the grain-oriented electrical steel 1. Note that, in the comparison test, the maximum magnetic flux density (Bmax) of the revolving magnetic field was 0.1 to 1.0 [T], the tilt angle ($\theta_B$) was 0 [deg], and the axis ratio ($\alpha$) was 1.

Also on the grain-oriented electrical steel 2 according to this second embodiment, since a magnetic domain ultra-refinement process is carried out by the scratching process in two directions intersecting each other, magnetic domains are finely divided not only in the width direction, which is the direction TD perpendicular (at right angles) to the rolling direction RD, but also in a length direction, which is a direction along the rolling direction RD, implementing an extremely fine magnetic domain structure. Consequently, even if a magnetic field is tilted to the direction in which magnetic domains are lined up, the magnetic domain wall moves according to the tilt of the magnetic field in each of the magnetic domains lined up in the length direction, allowing the magnetic domain walls to move smoothly and thereby making it possible to reduce iron loss even when the steel is magnetized in a direction at angles to the rolling direction RD.

Third Embodiment

Figure 13:
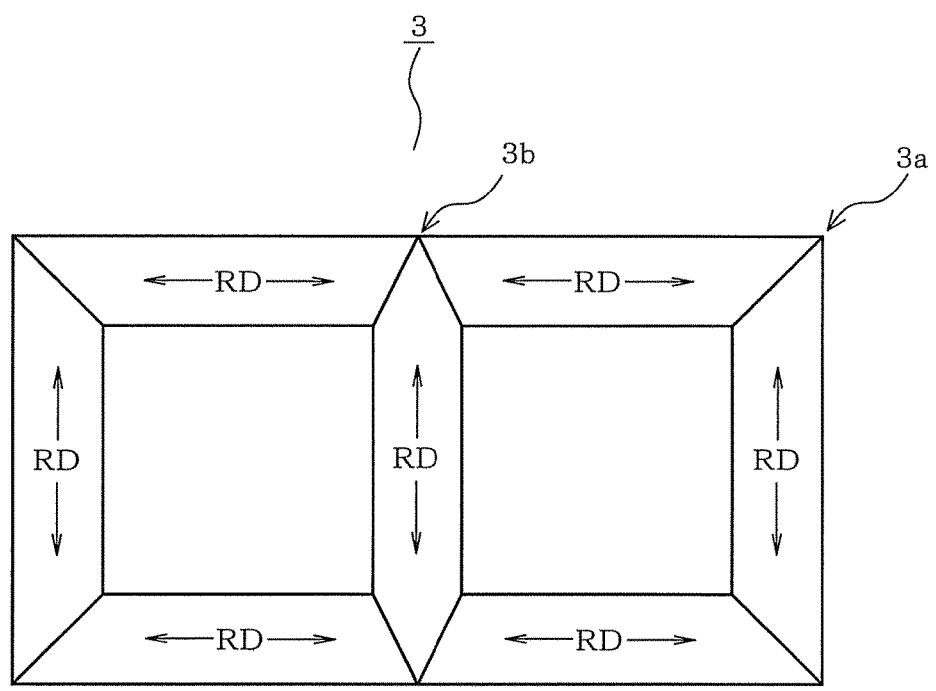
FIG. 13 is a diagram schematically showing a configuration example of an iron core of a three phase transformer.

The third embodiment is an embodiment which relates to an iron core constructed from the grain-oriented electrical steel 1 or grain-oriented electrical steel 2 described above. That is, for example, as shown in FIG. 13, an iron core 3 of a three phase transformer is configured to have corner portions 3a connected in an L-shape and so-called T-joints 3b connected in a T-shape. The corner portions 3a and T-joints 3b are magnetized also in a direction at angles to the rolling direction of the grain-oriented electrical steel from which these components are constructed. Therefore, by constructing the iron core 3 from the grain-oriented electrical steel 1 or grain-oriented electrical steel 2 described above, it is possible to effectively attain the operations and effects described above.

Fourth Embodiment

Figure 14:
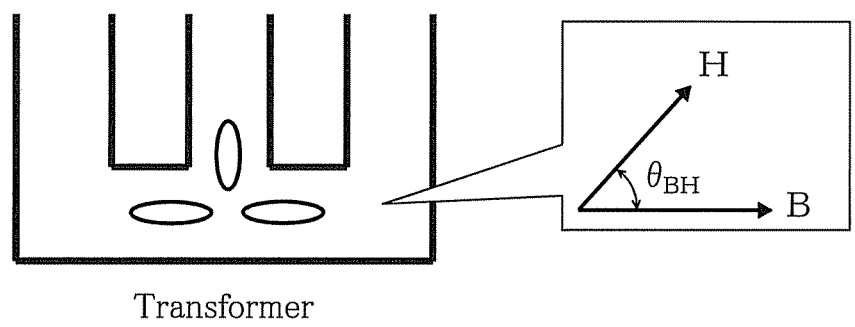
FIG. 14 is a diagram schematically showing how a revolving magnetic field is generated in a T-joint.

The fourth embodiment is an embodiment which relates to an iron core at least part of which is constructed from the grain-oriented electrical steel 1 or grain-oriented electrical steel 2 described above. That is, it has been recognized that a revolving magnetic field is generated, in the iron core 3 of a three phase transformer, and especially in T-joints 3b, for example, as shown in FIG. 14, and magnetization occurs also in a direction at angles to the rolling direction of the grain-oriented electrical steel from which these components are constructed. Therefore, large iron loss is caused by a revolving magnetic field especially in the T-joints 3b.

Thus, by constructing the T-joints 3b of the iron core 3 from the grain-oriented electrical steel 1 or grain-oriented electrical steel 2 described above, it is possible to effectively attain the operations and effects described above. Also, by constructing only the T-joints 3b, which are part of the iron core 3, from the grain-oriented electrical steel 1 or grain-oriented electrical steel 2, it is possible to curb usage of the grain-oriented electrical steel 1 or grain-oriented electrical steel 2 and thereby effectively attain the operations and effects described above while controlling costs required for the scratching process.

Fifth Embodiment

Figure 15:
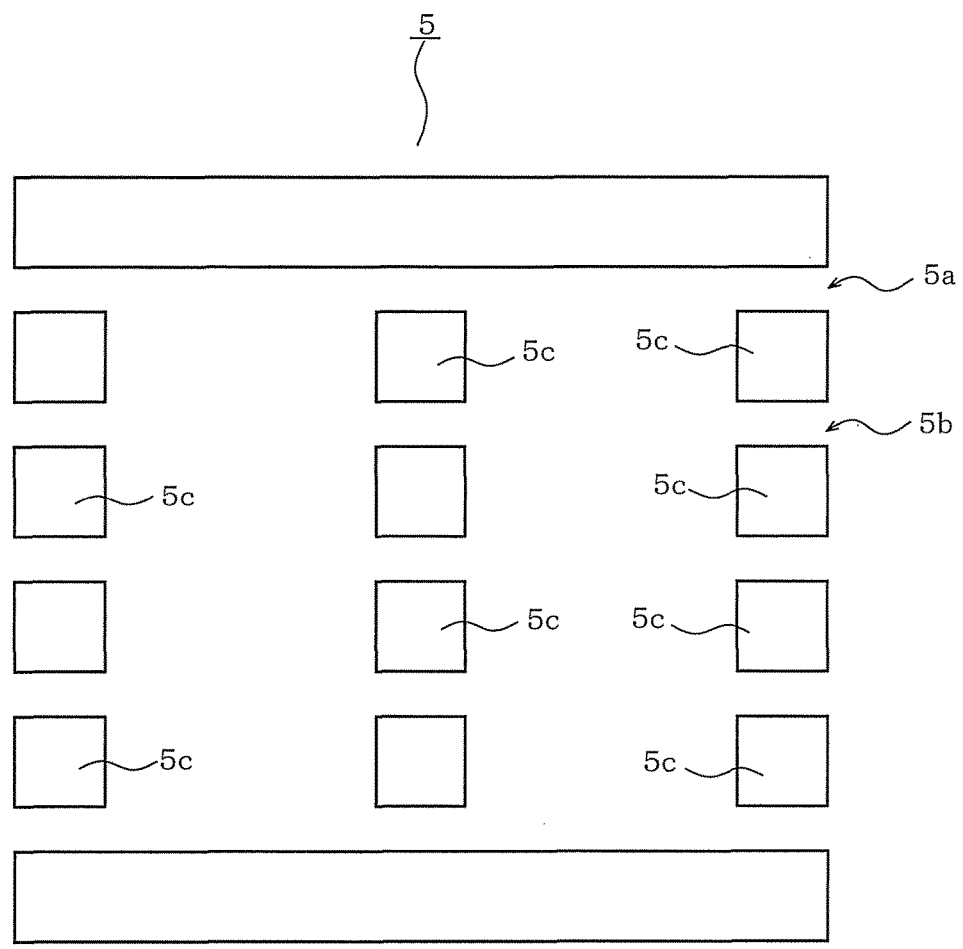
FIG. 15 is a diagram schematically showing a configuration example of an iron core having gaps.
Figure 16:
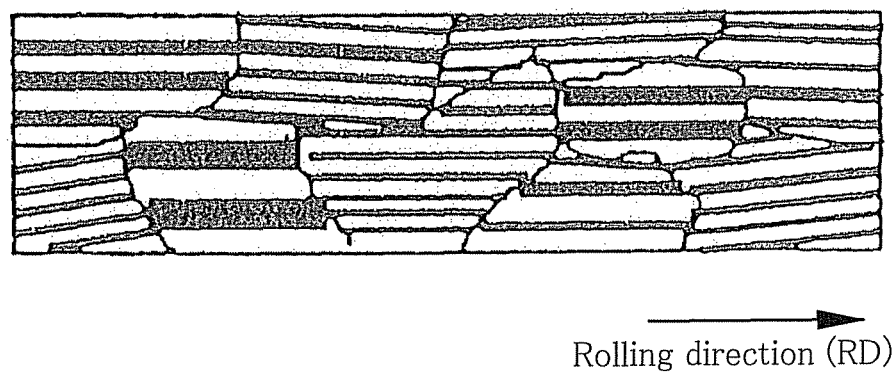
FIG. 16 is a diagram schematically showing an example of a crystal structure of grain-oriented electrical steel.
Figure 17:
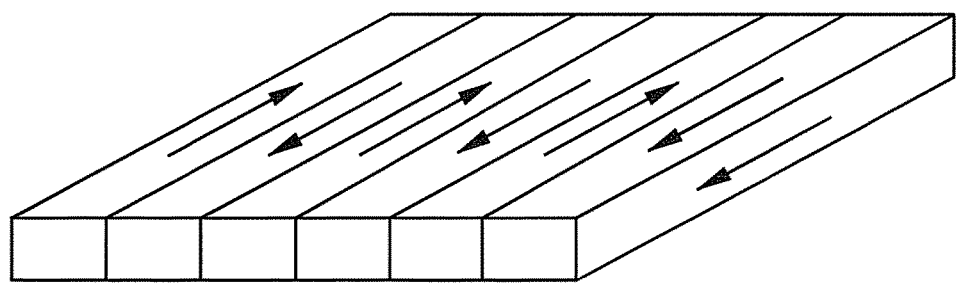
FIG. 17 is a diagram schematically showing how each crystal of grain-oriented electrical steel has fine magnetic domains.

The fifth embodiment is an embodiment which relates to an iron core constructed from the grain-oriented electrical steel 1 or grain-oriented electrical steel 2 described above. That is, an iron core 5 having gaps shown, for example, in FIG. 15 is adopted, for example, in reactors, transformers of some converters, and the like. Note that vacant spaces serving as gaps are filled with non-illustrated insulating material or the like. In the iron core 5 of this type, for example, a neighboring part 5a or neighboring part 5b of the gap is magnetized also in a direction at angles to the rolling direction of the grain-oriented electrical steel from which the part is constructed. Therefore, by constructing the iron core 5 from the grain-oriented electrical steel 1 or grain-oriented electrical steel 2 described above, it is possible to effectively attain the operations and effects described above.

Sixth Embodiment

The sixth embodiment is an embodiment which relates to an iron core at least part of which is constructed from the grain-oriented electrical steel 1 or grain-oriented electrical steel 2 described above. That is, for example, in the iron core 3 or iron core 5, especially a yoke portion not wound with a coil strongly tends to be magnetized in a direction approximately at right angles to the rolling direction of the grain-oriented electrical steel from which this part is constructed.

Thus, by constructing all or at least part of the yoke portion not wound with a coil from the grain-oriented electrical steel 1 or grain-oriented electrical steel 2 described above, it is possible to effectively attain the operations and effects described above. Also, by constructing only the yoke portion, which is part of the iron core, from the grain-oriented electrical steel 1 or grain-oriented electrical steel 2, it is possible to curb usage of the grain-oriented electrical steel 1 or grain-oriented electrical steel 2 and thereby effectively attain the operations and effects described above while controlling costs required for the scratching process.

Seventh Embodiment

The seventh embodiment is an embodiment which relates to an iron core at least part of which is constructed from the grain-oriented electrical steel 1 or grain-oriented electrical steel 2 described above. That is, for example, in an iron core 5 having gaps, a leg portion wound with a coil is made up of plural block iron cores 5c. Therefore, due to a spread of the magnetic flux, i.e., so-called fringing, occurring in a gap portion, the block iron cores 5c are magnetized also in a direction other than the rolling direction of the grain-oriented electrical steel from which the block iron cores 5c are constructed.

Thus, by constructing the block iron cores 5c of the leg portion from the grain-oriented electrical steel 1 or grain-oriented electrical steel 2 described above, it is possible to effectively attain the operations and effects described above. Also, by constructing only the leg portion which is part of the iron core or even only the block iron cores 5c of the leg portion from the grain-oriented electrical steel 1 or grain-oriented electrical steel 2, it is possible to curb usage of the grain-oriented electrical steel 1 or grain-oriented electrical steel 2 and thereby effectively attain the operations and effects described above while controlling costs required for the scratching process. Furthermore, by constructing only block iron cores 5c at an upper end and block iron cores 5c at a lower end among the plural block iron cores 5c from the grain-oriented electrical steel 1 or grain-oriented electrical steel 2, it is possible to effectively attain the operations and effects described above while further controlling costs required for the scratching process.

Eighth Embodiment

The eighth embodiment is an embodiment which relates to an iron core constructed from the grain-oriented electrical steel 1 or grain-oriented electrical steel 2 described above. That is, most part of an iron core of a dynamo-electric machine is magnetized also in a direction tilted with respect to the rolling direction of the grain-oriented electrical steel. Therefore, by constructing the iron core of the dynamo-electric machine from the grain-oriented electrical steel 1 or grain-oriented electrical steel 2 described above, it is possible to effectively attain the operations and effects described above.

Other Embodiments

The present embodiments are not limited to the plural embodiments described above, and the embodiments described above can be modified or expanded, for example, as follows.

For example, the magnetic domain ultra-refinement process by means of the scratching process may be applied to grain-oriented electrical steel in two intersecting directions using a well-known plasma gun. Also, the magnetic domain ultra-refinement process by means of the scratching process may be applied to grain-oriented electrical steel in two intersecting directions using non-illustrated minute gears. Besides, methods for applying the magnetic domain ultra-refinement process by means of the scratching process are not limited to a method based on laser irradiation, a method based on plasma irradiation, and a mechanical method using gears.

The vector magnetic characteristic controlled material according to the present embodiments described above is obtained by applying the magnetic domain ultra-refinement process by means of the scratching process to a surface of grain-oriented electrical steel in two directions intersecting each other. Also, the iron core according to the present embodiments described above is constructed from the grain-oriented electrical steel subjected to the magnetic domain ultra-refinement process by means of the scratching process in the two directions intersecting each other. Thus, the vector magnetic characteristic controlled material according to the present embodiments or the iron core resulting from application of the vector magnetic characteristic controlled material can reduce iron loss even when the steel is magnetized in a direction at angles to the rolling direction RD.

Note that embodiments describing the vector magnetic characteristic controlled material and applications thereof are presented by way of example, and not intended to limit the scope of the invention. These novel embodiments can be implemented in various other forms, and various omissions, replacements, and changes can be made without departing from the spirit of the invention. The embodiments and modifications thereof are included in the scope of technical conditions described as the features.

DESCRIPTION OF SYMBOLS

In the drawings, reference numeral 1 denotes grain-oriented electrical steel, 2 denotes grain-oriented electrical steel, 3 denotes an iron core of a three phase transformer (iron core), and 5 denotes an iron core having gaps (iron core).

The invention claimed is:

1. A vector magnetic characteristic controlled material, comprising:
   a grain-oriented electrical steel to which a magnetic domain ultra-refinement process has been applied, the steel including a surface on which continuous and linear scratches are formed in two directions intersecting each other at approximately right angles and having parallel spacing of between about 0.25 mm and about 0.50 mm and in both directions, wherein the parallel spacing is the distance separating parallel scratches, and wherein the material has a magnetic domain structure in which each magnetic domain is divided into plural granular magnetic domains.

2. An iron core, comprising:
   a vector magnetic characteristic controlled material including a grain-oriented electrical steel to which a magnetic domain ultra-refinement process has been applied, the steel including a surface on which continuous and linear scratches are formed in two directions intersecting each other at approximately right angles and having parallel spacing of between about 0.25 mm and about 0.50 mm and in both directions, wherein the parallel spacing is the distance separating parallel scratches, and wherein the material has a magnetic domain structure in which each magnetic domain is divided into plural granular magnetic domains.

3. The iron core according to claim 2, wherein the iron core is an iron core of a three phase transformer and is constructed from the vector magnetic characteristic controlled material.

4. The iron core according to claim 2, wherein the iron core is an iron core of a three phase transformer and is provided with a T-joint constructed from the vector magnetic characteristic controlled material.

5. The iron core according to claim 2, comprising a gap, wherein the iron core is constructed from the vector magnetic characteristic controlled material.

6. The iron core according to claim 2, comprising a yoke portion constructed from the vector magnetic characteristic controlled material.

7. The iron core according to claim 2, comprising a leg portion constructed from the vector magnetic characteristic controlled material.

8. The iron core according to claim 2, wherein the iron core is an iron core of a rotating machine and is constructed from the vector magnetic characteristic controlled material.

* * * * *